United States Patent
Huang

(10) Patent No.: US 6,704,629 B2
(45) Date of Patent: Mar. 9, 2004

(54) DEVICE FOR MONITORING MOTOR VEHICLE'S ELECTRIC POWER AND METHOD THEREFOR

(75) Inventor: Yung-Sheng Huang, Taipei (TW)

(73) Assignee: BPPower, Inc., Taipei (TW)

( * ) Notice: Subject to any disclaimer, the term of this patent is extended or adjusted under 35 U.S.C. 154(b) by 0 days.

(21) Appl. No.: 09/996,813

(22) Filed: Nov. 30, 2001

(65) Prior Publication Data

US 2003/0105564 A1 Jun. 5, 2003

(51) Int. Cl.[7] ............................... G06F 7/00; H02J 7/00
(52) U.S. Cl. ....................... 701/29; 701/31; 701/33; 702/63; 307/10.7; 361/78; 324/433; 320/134; 320/136
(58) Field of Search ................... 701/29, 31, 33; 320/116, 104, 136, 123, 139, 163, DIG. 21, 119, 118, 121, 132, 133, 134, 135; 324/429, 428, 426; 361/78–79, 86–87; 340/657, 660, 661, 662, 663; 702/63, 57–59, 66–67; 307/10.7

(56) References Cited

U.S. PATENT DOCUMENTS

| | | | | |
|---|---|---|---|---|
| 3,852,732 A | * | 12/1974 | Yorksie et al. | 320/136 |
| 3,979,657 A | * | 9/1976 | Yorksie | 320/136 |
| 4,193,026 A | * | 3/1980 | Finger et al. | 324/428 |
| 5,027,294 A | * | 6/1991 | Fakruddin et al. | 713/300 |
| 5,130,699 A | * | 7/1992 | Reher et al. | 340/661 |
| 5,193,067 A | * | 3/1993 | Sato et al. | 702/63 |
| 5,764,469 A | * | 6/1998 | Slepian et al. | 361/92 |
| 6,072,300 A | * | 6/2000 | Tsuji | 320/116 |
| 6,201,373 B1 | * | 3/2001 | Arai et al. | 320/132 |
| 6,531,875 B2 | * | 3/2003 | Satake | 324/429 |
| 2003/0067221 A1 | * | 4/2003 | Disser et al. | 307/10.1 |

* cited by examiner

Primary Examiner—Jacques H. Louis-Jacques
(74) Attorney, Agent, or Firm—Troxell Law Office PLLC

(57) ABSTRACT

A method and a device for monitoring a motor vehicle's electric power, in which the method comprises the steps of sampling, calculating, comparing, displaying results, and counting intervals, and the device comprises a stabilizing circuit, a CPU, a voltage sampling circuit, a current control circuit, and a color lamp display circuit. The step of sampling is performed when the load and power transistor are enabled (i.e., there is a great amount of current) and with a very short sampling time so that the invention can inform a driver about a status of a battery by consuming very little power.

15 Claims, 10 Drawing Sheets

DEVICE FOR MONITORING MOTOR VEHICLE'S ELECTRIC POWER AND METHOD THEREFOR

BACKGROUND OF THE INVENTION

1. Field of the Invention

The present invention relates to monitor device and more particularly to a device for monitoring a motor vehicle's electric power (including a battery and an alternator or charger) and method therefor.

2. Description of Related Art

A conventional battery (e.g., NP battery) has a characteristic curve as shown in FIG. 9 wherein the smaller the discharge current the longer time the stable output voltage will be. Also, both ambient temperature and storage time affect the available power of battery as indicated by graphs of FIGS. 10 and 11 respectively. Moreover, a useful life of battery is mainly affected by ambient temperature, charging technique and time, and discharge technique. In addition, prior art does not provide a way to inform driver about the status of battery in a near real time basis. Typically, driver inspects battery only when it is abnormally low. As to a faulty alternator, it is typical for a driver to contact a technician for assistance. This is not convenient especially in an emergency. Thus improvement exists.

SUMMARY OF THE INVENTION

It is an object of the present invention to provide a device for monitoring a motor vehicle's electric power and method therefor. The method comprises sampling, calculating, comparing, displaying result, and counting interval. The device comprises a stabilizing circuit, a CPU, a voltage sampling circuit, a current control circuit, and a color lamp display circuit. The invention can inform driver about status of battery by consuming very little power.

The above and other objects, features and advantages of the present invention will become apparent from the following detailed description taken with the accompanying drawings.

DETAILED DESCRIPTION OF THE PREFERRED EMBODIMENTS

Figure 1:
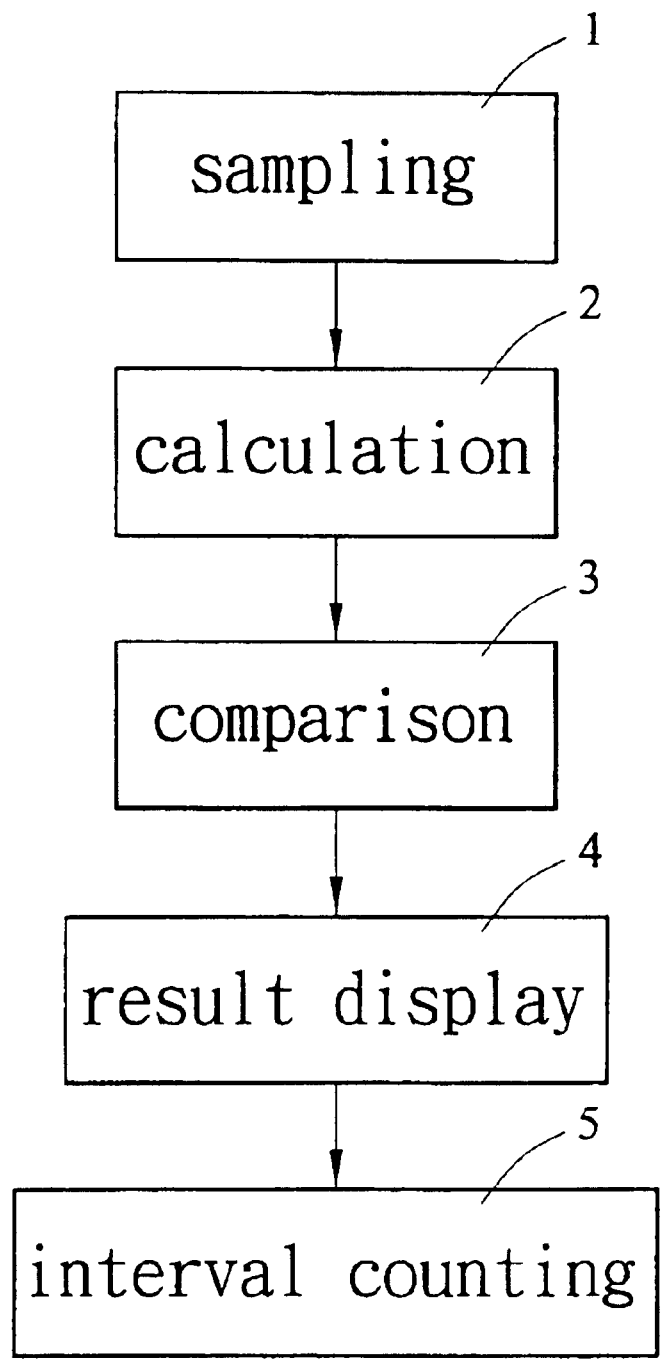
FIG. 1 is a flow chart illustrating a routine for monitoring a motor vehicle's electric power according to the invention.

Referring to FIG. 1, there is shown a routine for monitoring a motor vehicle's electric power in accordance with the invention. The routine comprises the following steps:

In step 1 (i.e., sampling), a power transistor is used as a switch which is activated to discharge a battery to be measured in a very short time so as to obtain a sampled voltage value. Note that the sampling may be performed more than once (i.e., N time where N>1) as required by the invention in order to obtain N sampled voltage values.

In step 2 (i.e., calculation), an average value of N sampled voltage values is calculated.

Figure 9:
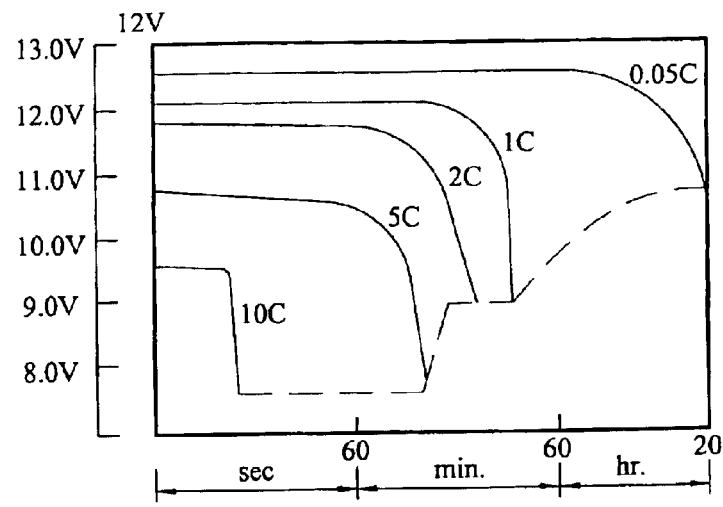
FIG. 9 is graph illustrating discharge current versus discharge time according to a conventional NP battery.

In step 3 (i.e., comparison), since there is a significant drop of voltage when a certain point of time is passed (see FIG. 9), the invention sets a warning value for comparing it with the average value. Note that warning value may be divided into a plurality of intermediate values so as to effect a multilevel warning.

In step 4 (i.e., result display), a result of calculation in step 2 is displayed on a display device. Further, a warning is issued if warning value is reached in step 3. Note that above four steps are monitor processes.

In step 5 (i.e., interval counting), a count is performed until a period of time (i.e., time interval) set by the invention is reached. Then a next measuring of electric power is immediately performed.

Figure 2:
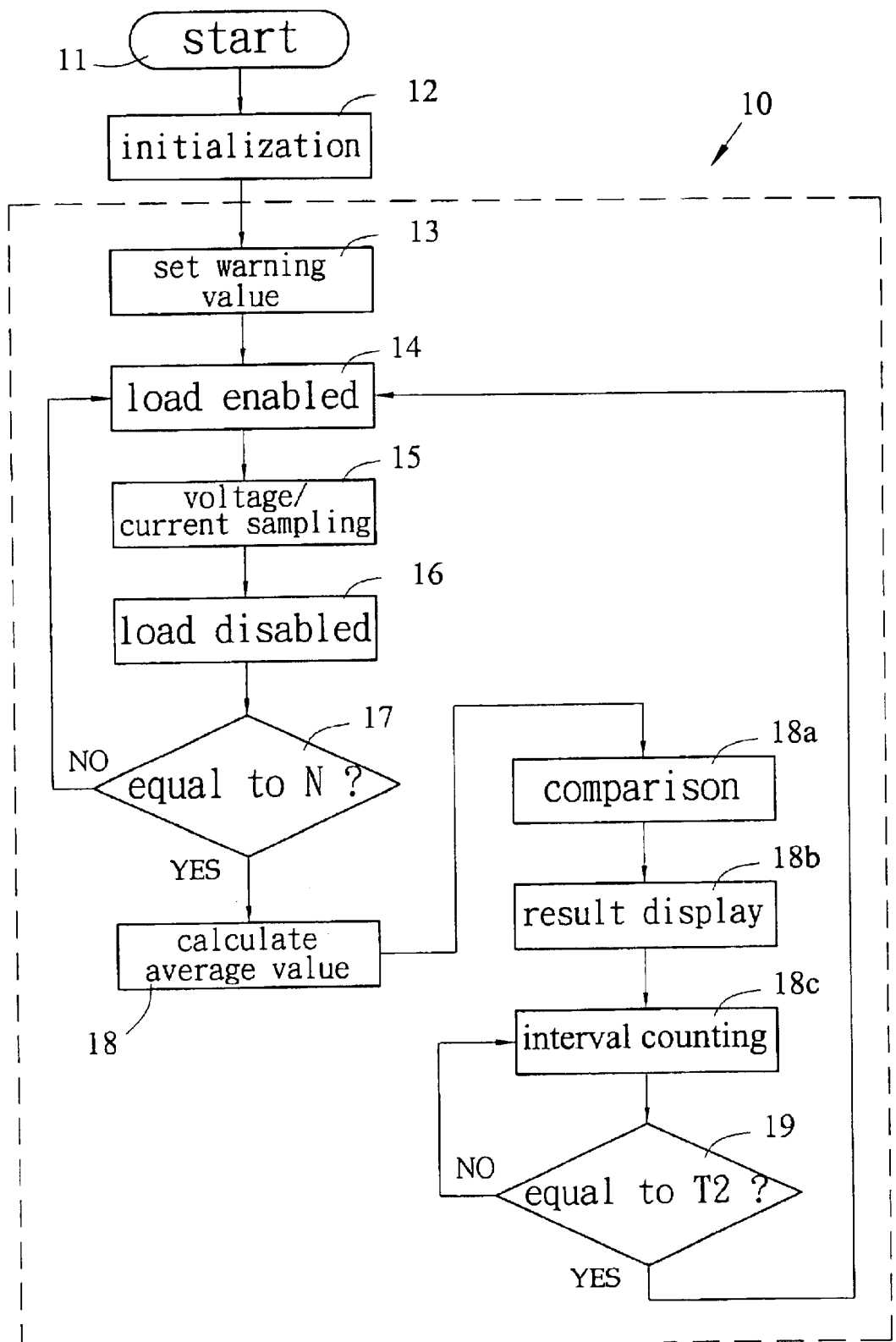
FIG. 2 is a detailed flow chart illustrating the FIG. 1 routine.

Referring to FIG. 2, there is shown a detailed flow chart illustrating the FIG. 1 routine. Step 11 is a beginning where an interrupt vector address is the beginning of the routine. Step 12 is an initialization where registers and I/O pins are initialized and interrupt vector and timer are enabled. Following are steps of a software 10 installed in the monitor device of the invention. In step 13, warning value is set. In step 14, load and power transistor are enabled. Thus current is flowed on load. Also, a first count of timer is set as 0. In step 15, voltage is sampled wherein period of time of sampling is T1. Further, a first count of sampling is increased by one. Also, current may be derived from a well known equation regarding voltage and current. Hence, it is also a current sampling step. In step 16, load and power transistor are disabled. Thus there is no current on load. In step 17, it is determined that whether the times of sampling (i.e., first count) is equal to N. If yes, process goes to step 18. Otherwise, process loops back to step 14. In step 18, an average of sampled voltage (or current) values is calculated. In step 18a, a comparison is performed wherein result of step 18 is compared with a warning value and a second count of timer is set as 0. In step 18b, a result display is performed, i.e., result of step 18 is displayed. Further, a warning is issued if warning value is reached. In step 18c, a second count is increased by 1. In step 19, it is determined that whether count of the timer is equal to a period of time (i.e., time interval T2 as detailed later). If yes, process loops back to step 14. Otherwise, process loops back to step 18c. Note that steps 14 to 19 are major steps of the software 10.

Figure 2A:
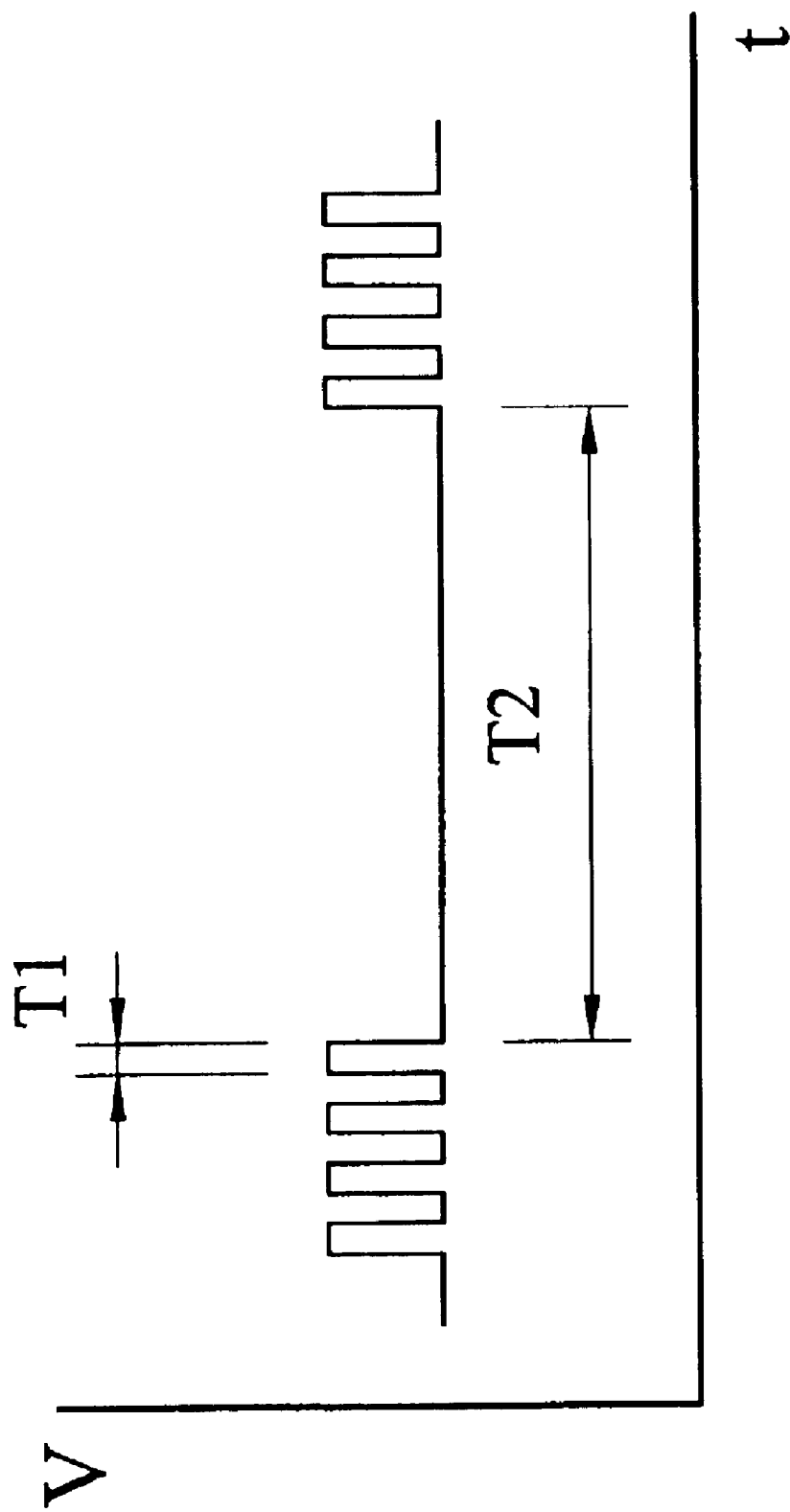
FIG. 2A is a graph illustrating sampling time versus voltage according to the invention.

Referring to FIG. 2A, a graph illustrates sampling time versus voltage according to the invention. As shown, axis of abscissa is time (t) and axis of ordinate is voltage value (V). T1 is a period of time for sampling voltage. Preferably, T1 is less than 1,000 μsec. More preferably, T1 is 50 μsec. T2 is a time interval between two sets of sampling (or display time). In other words, each set of sampling comprises N times of sampling. Further, a result will be displayed only after the N times of sampling have been completed. At this time, a count of timer is performed until the count is equal to T2. This cycle repeats for continuously monitoring vehicle's electric power.

Figure 3:
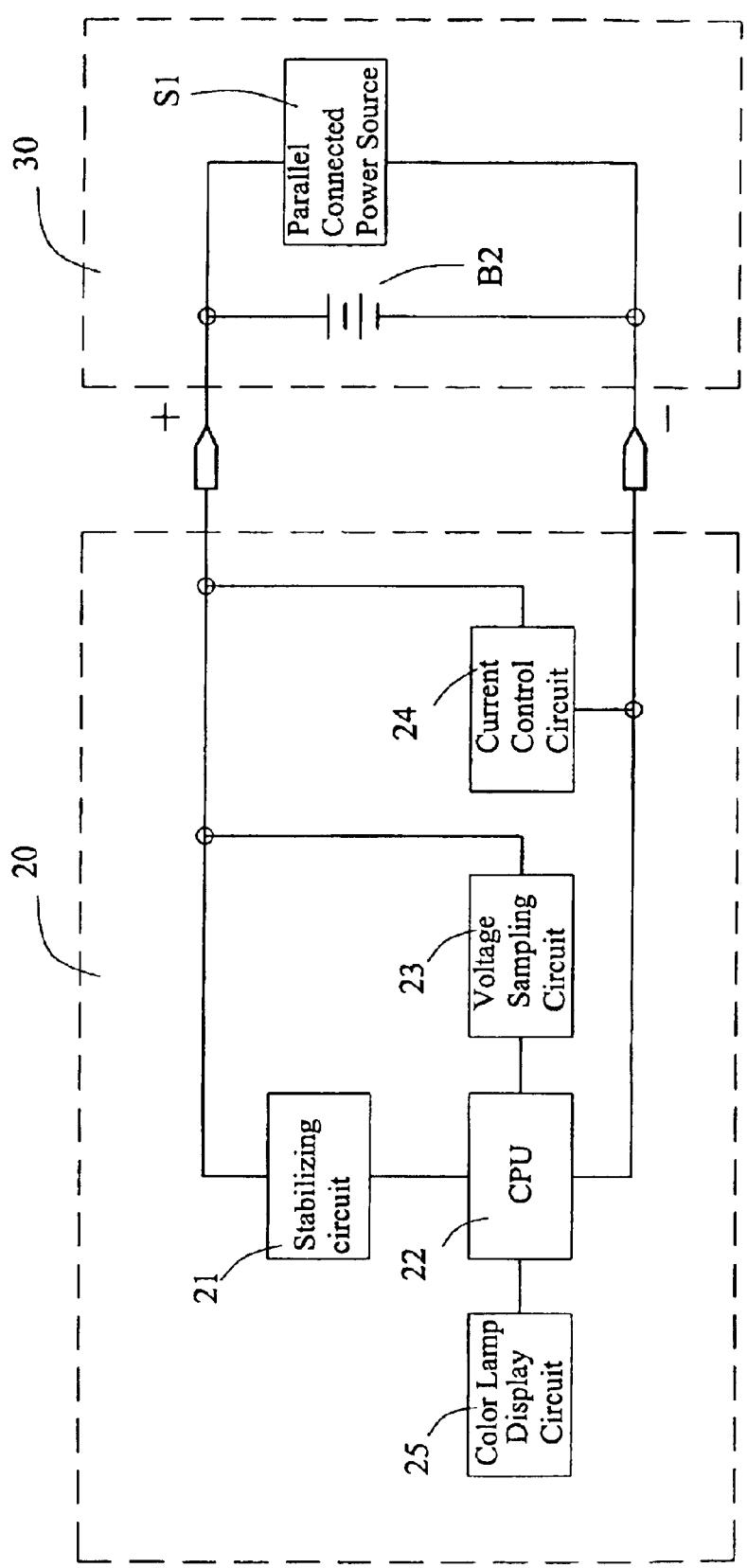
FIG. 3 is a block diagram of a first preferred embodiment of device for monitoring vehicle's electric power according to the invention.

FIG. 3 is a block diagram of a first preferred embodiment of device 20 for monitoring vehicle's electric power 30 according to the invention. The electric power 30 to be measured is parallel connected to the monitor device 20. Electric power 30 comprises a battery B2 and a parallel connected power source S1. The monitor device 20 comprises a stabilizing circuit 21, a CPU (central processing unit) 22, a voltage sampling circuit 23, a current control circuit 24, and a color lamp display circuit 25. Stabilizing circuit 21 acts to provide a constant current to CPU 22 and other components. CPU 22 acts to control sampling of voltage (or current), data storage, calculation, result display, etc. Voltage sampling circuit 23 is commanded by CPU 22 to fetch data of current and voltage from electric power 30. Current control circuit 24 is commanded by CPU 22 to control current on load so as to measure current of electric power 30 which is in the range of about 1A to about 300A. Color lamp display circuit 25 is commanded by CPU 22 to show one of a variety of color lamps based on a measure result. In operation, current is flowed from battery B2 to stabilizing circuit 21 and CPU 22. CPU 22 first reads voltage value of battery B2 with no load applied. Then CPU samples voltage value of battery B2 through voltage sampling circuit 23 during a very short sampling time T1 with load applied on current control circuit 24. Preferably, N (i.e., the times for sampling voltage value of battery B2) is in the range of 2 and 4. After the sampling (i.e., at time interval T2), current control circuit 24 is disabled prior to calculating an average value of N times of sampling. Next result is sent to color lamp display circuit 25 for display. In brief, the invention employs a large current load discharge for correctly reading a voltage value of battery B2, resulting in an energy saving. Note that power source S1 is an alternator or charger.

Figure 4:
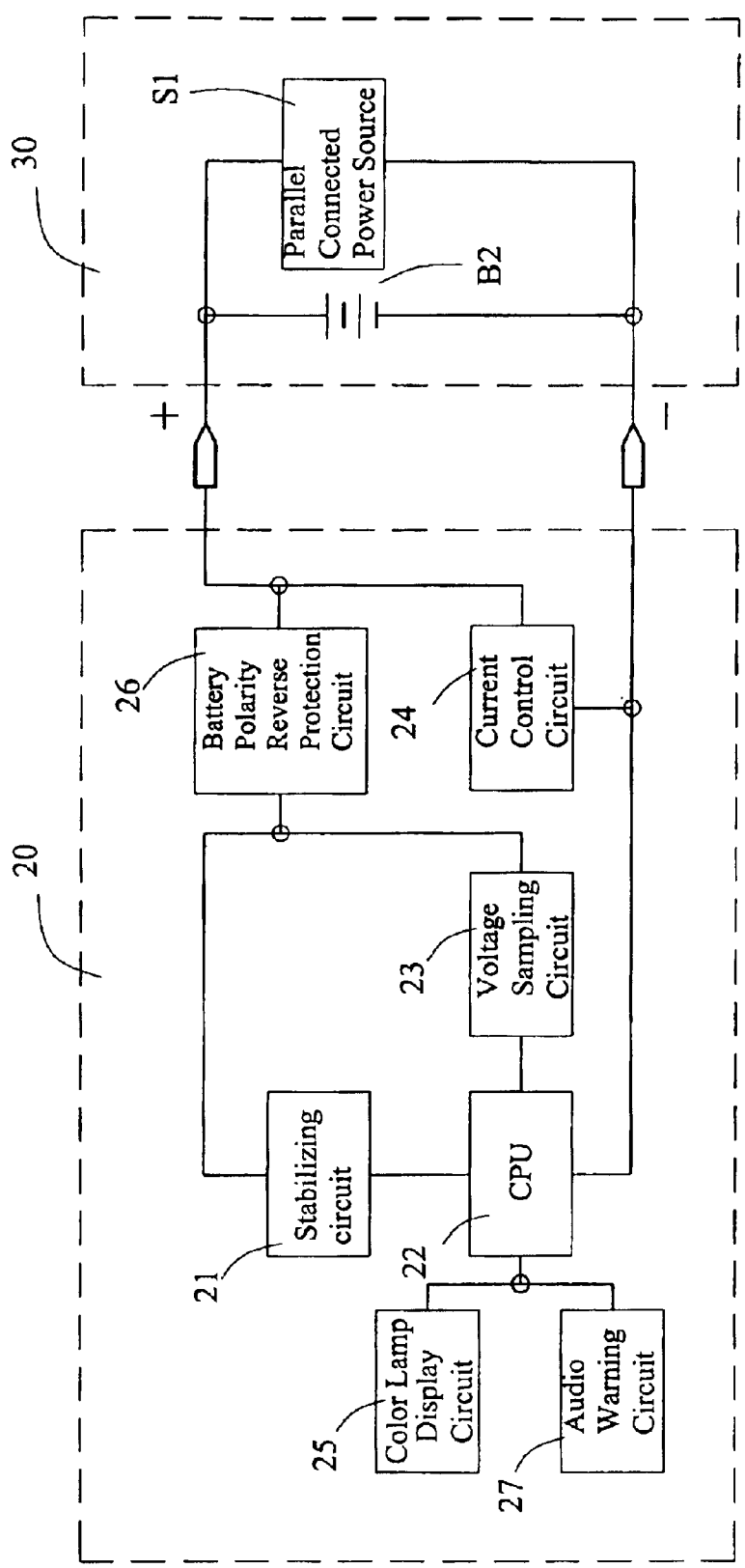
FIG. 4 is a block diagram of a second preferred embodiment of device for monitoring vehicle's electric power according to the invention.

Referring to FIG. 4, there is shown a second preferred embodiment of device 20 for monitoring vehicle's electric power 30 according to the invention. In the embodiment, monitor device 20 further comprises a battery polarity reverse protection circuit 26 for preventing a damage on electric power 30 from occurring due to polarity reverse of battery and an audio warning circuit 27 commanded by CPU 22 to issue an audio warning on an irregularity (e.g., battery low) based on a measure result, battery aging, or battery damage.

Figure 5:
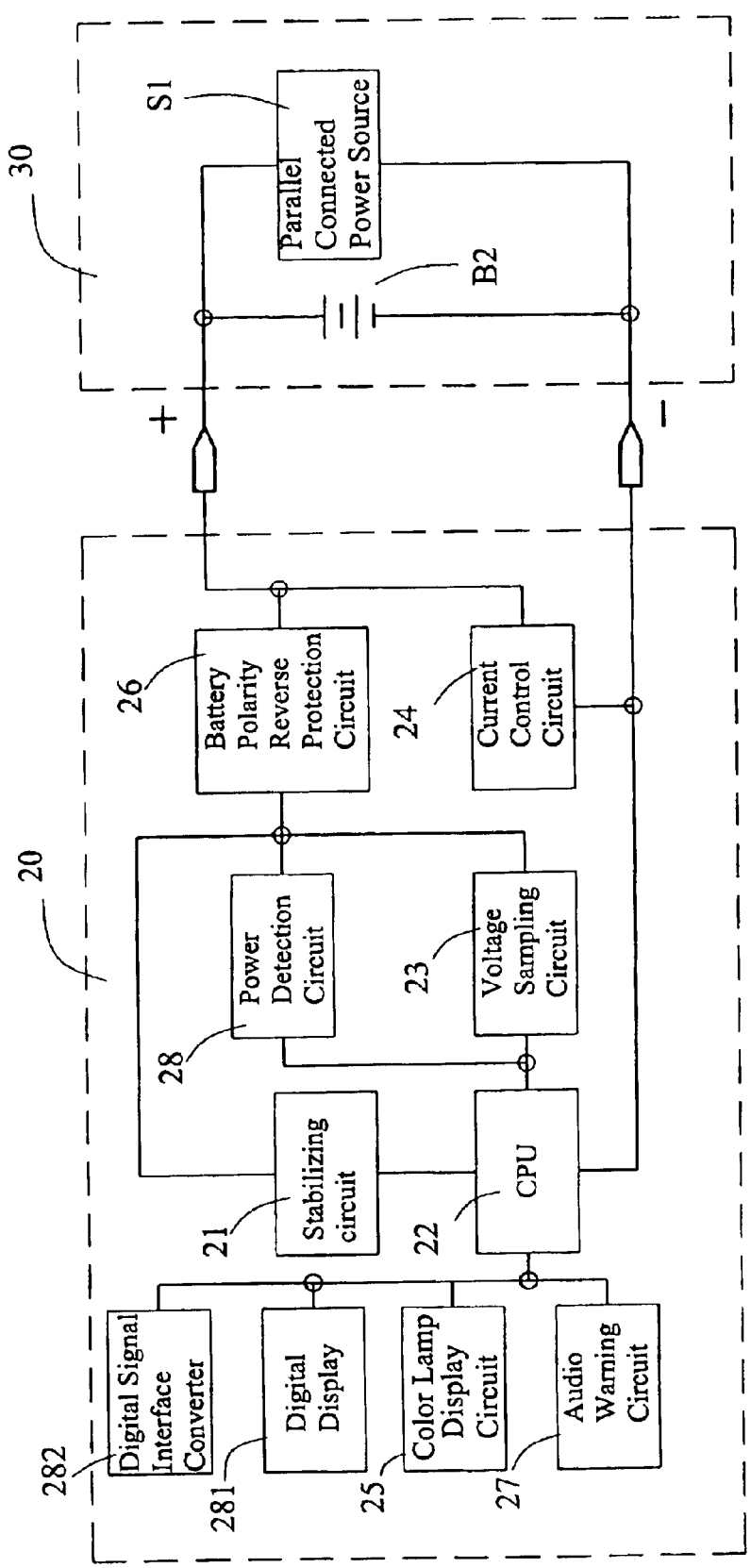
FIG. 5 is a block diagram of a third preferred embodiment of device for monitoring vehicle's electric power according to the invention.

FIG. 5 is a block diagram of a third preferred embodiment of device 20 for monitoring vehicle's electric power 30 according to the invention. In the embodiment, monitor device 20 further comprises a power detection circuit 28 commanded by CPU 22 to fetch data of current and voltage from electric power 30 to send to CPU 22 for determining a status of electric power 30, a digital display 281 commanded by CPU 22 to display a measure result, and a digital signal interface converter 282 commanded by CPU 22 to communicate with external through an interface based on a measure result.

Figure 6:
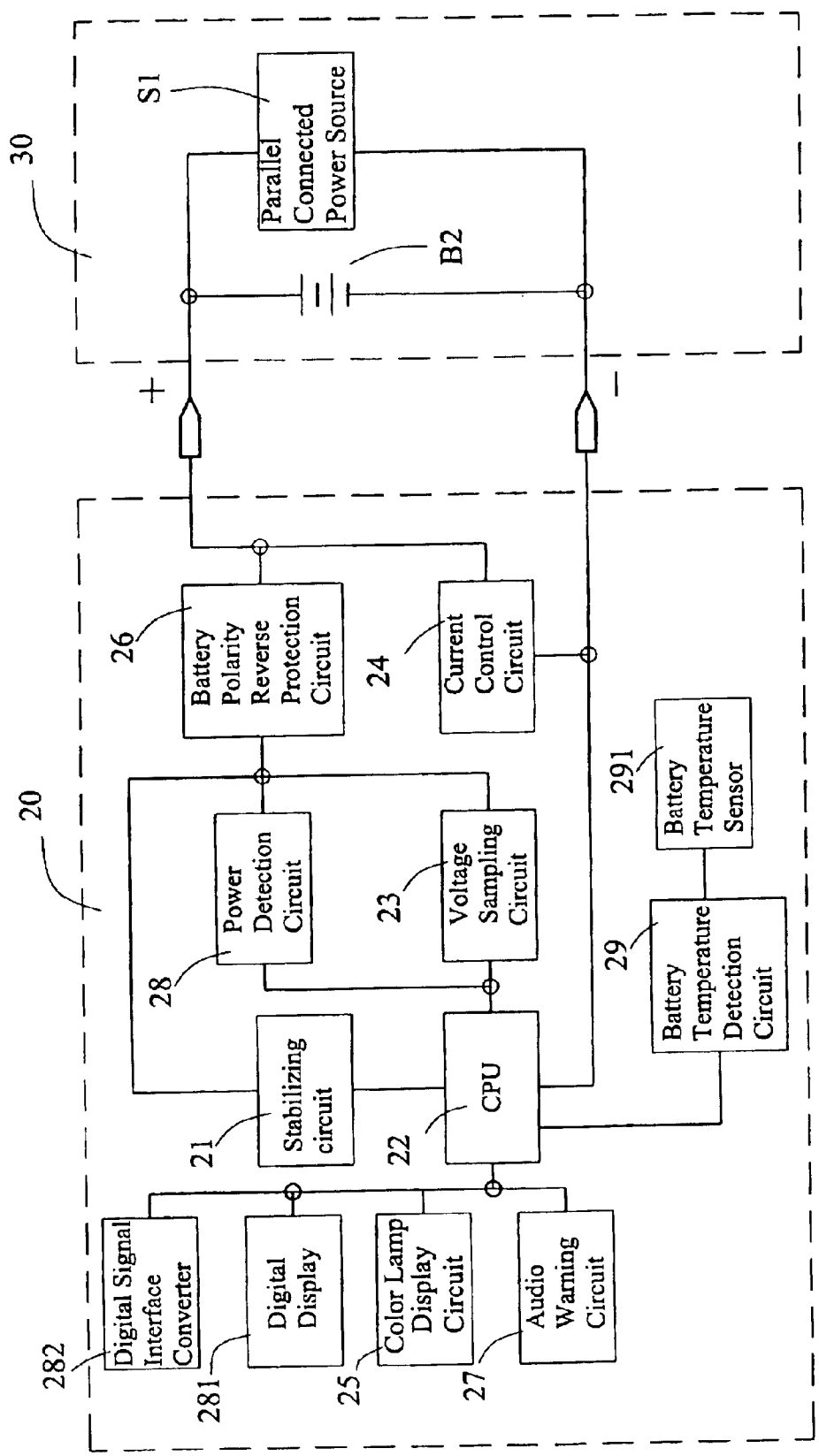
FIG. 6 is a block diagram of a fourth preferred embodiment of device for monitoring vehicle's electric power according to the invention.
Figure 10:
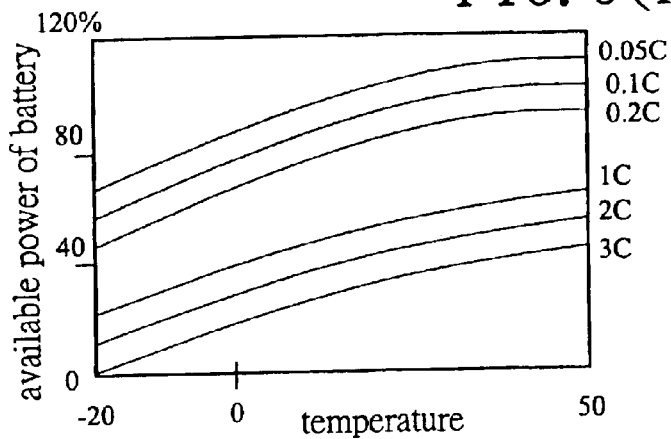
FIG. 10 is graph illustrating available power of battery versus ambient temperature according to a conventional NP battery.
Figure 11:
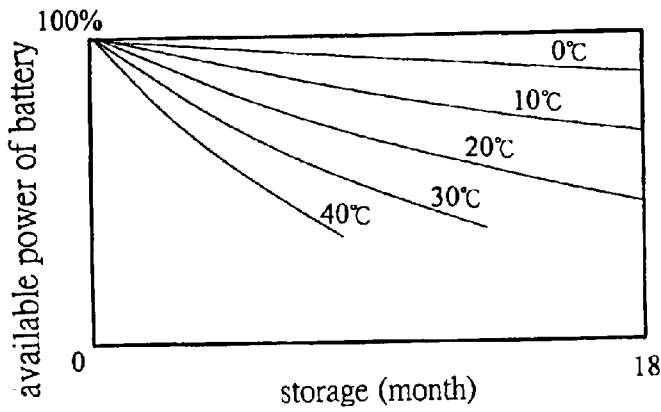
FIG. 11 is graph illustrating available power of battery versus storage time according to a conventional NP battery.

In the invention, monitor device is parallel connected to battery B2 and power source (e.g., alternator or charger) S1. When alternator is operating or charging, voltage measured on the parallel side will increase. In other words, a faulty alternator or charging irregularity can be easily found if such increase of voltage does not occur. With the provision of power detection circuit 28, it is possible of detecting such malfunction of electric power 30. Also, CPU 22 will issue a warning in form of lamp, audio, or digital display. Referring to FIG. 6, there is shown a fourth preferred embodiment of device 20 for monitoring vehicle's electric power 30 according to the invention. In the embodiment, monitor device 20 further comprises a battery temperature sensor 291 and a battery temperature detection circuit 29 for sending temperature data sensed by battery temperature sensor 291 to CPU 22 so as to calculate an available power of battery which is in turn used for modifying a warning value. For information about available power of battery versus temperature, refer to FIG. 10 above. This embodiment can prevent overcharge from occurring by monitoring temperature of battery B2.

Figure 7:
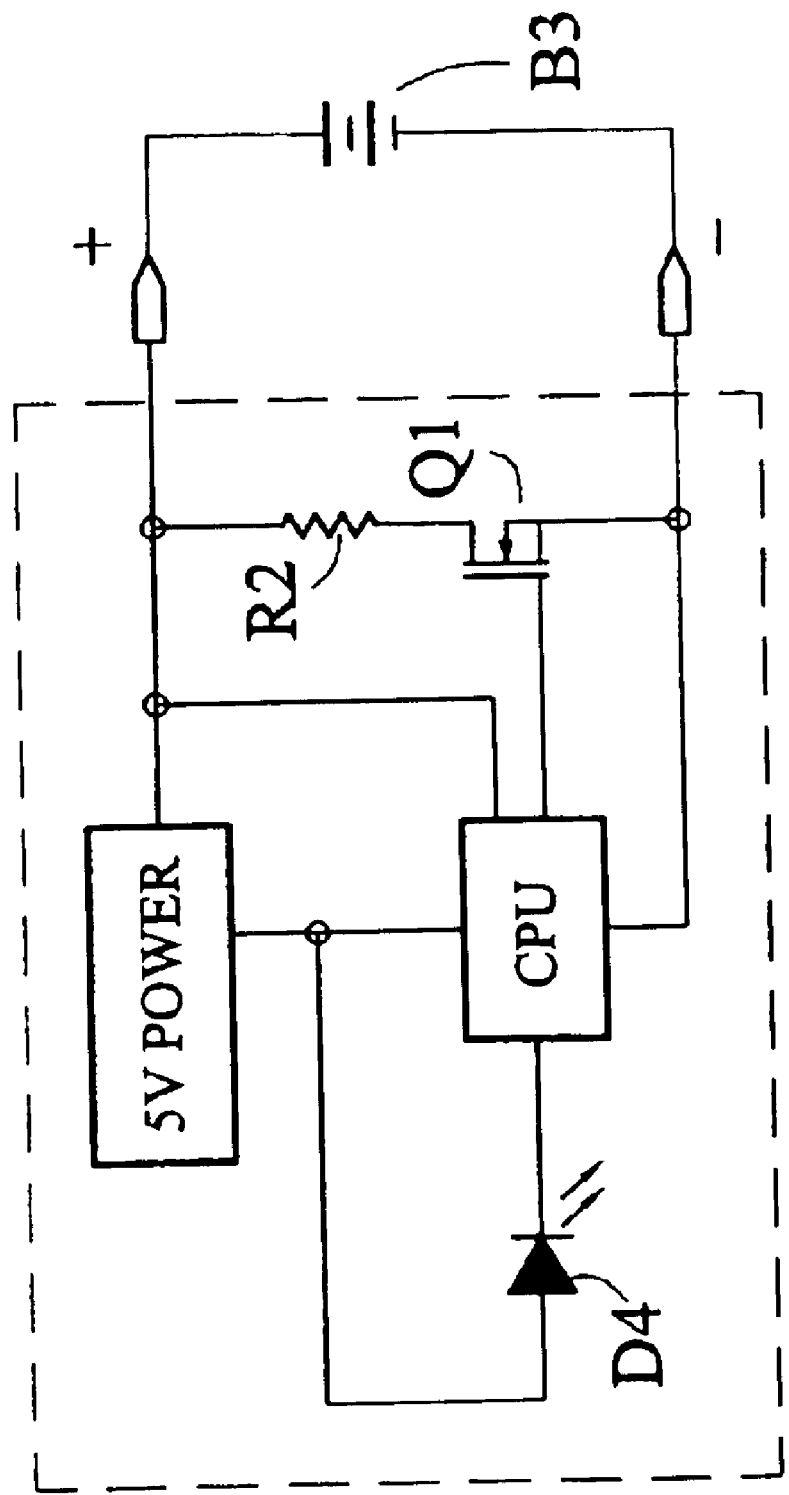
FIG. 7 depicts a circuit diagram of any of above preferred embodiments of device parallel connected to a vehicle's battery.
Figure 8:
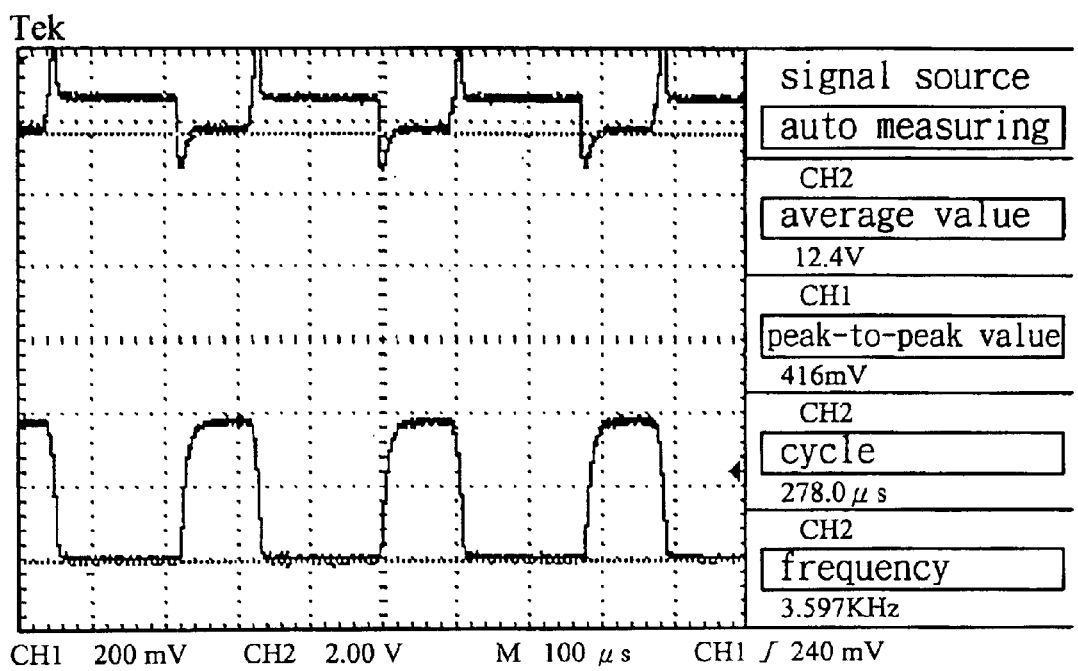
FIGS. 8 and 8A are graphs illustrating experimental data according to the device of the invention.
Figure 8A:
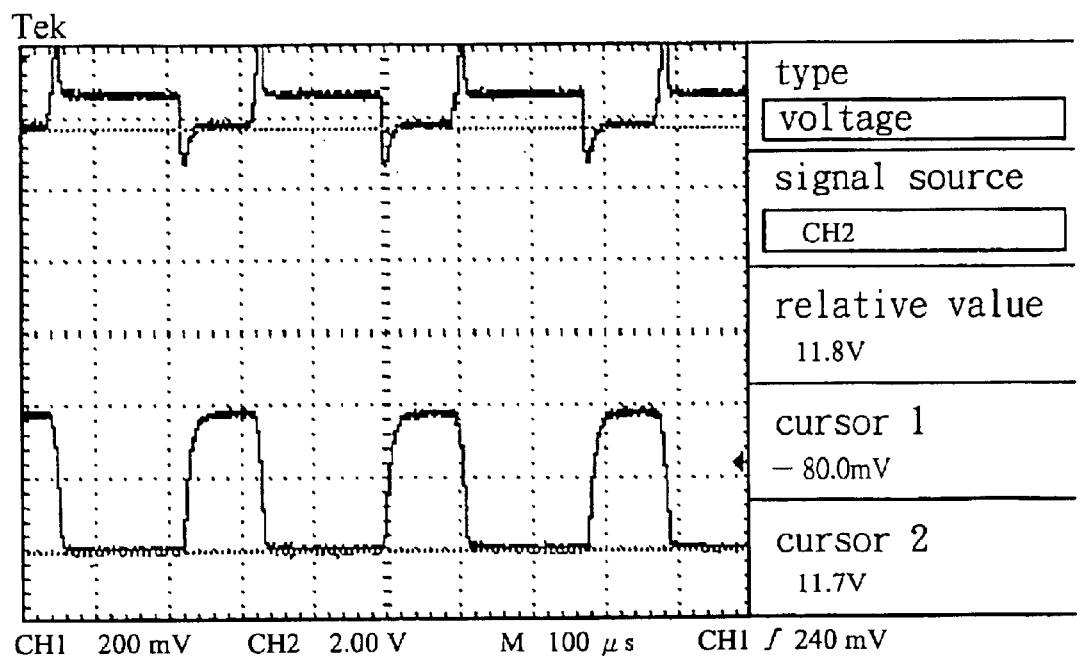

FIG. 7 depicts a circuit diagram of any of above preferred embodiments of monitor device which is parallel connected to a vehicle's battery. As shown, power transistor is labeled as Q1, resistor is labeled as R2, LED is labeled as D4, and battery to be measured is labeled as B3. FIGS. 8 and 8A are graphs illustrating experimental data according to the device of the invention.

While the invention herein disclosed has been described by means of specific embodiments, numerous modifications and variations could be made thereto by those skilled in the art without departing from the scope and spirit of the invention set forth in the claims.

What is claimed is:

1. A method for monitoring a motor vehicle's electric power, which comprises steps of:
   (1) beginning a routine in a system wherein an interrupt vector address is set as a beginning;
   (2) initializing the system wherein registers and I/O pins are initialized and an interrupt vector and a timer are enabled;
   (3) setting a warning value;
   (4) enabling a load and a power transistor for causing a current to flow on a load and setting a first count as 0;
   (5) sampling a voltage or current wherein a period of time of sampling is T1 and a first count is increased by 1;
   (6) disabling the load and a power transistor;
   (7) determining whether the first count is equal to N which is larger than 1 and if not, looping back to step (4);
   (8) calculating an average value of the sampled voltage or current;
   (9) comparing a result of the calculation with a warning value and setting a second count as 0;
   (10) displaying the result of the calculation and issuing a warning if the warning value is reached;
   (11) increasing a second count by 1; and
   (12) determining whether the second count is equal to a time interval of T2, if yes, looping back to step (4), and if not, looping back to step (11).

2. The method of claim 1, wherein the warning value is divided into a plurality of intermediate values for effecting a multilevel warning.

3. The method of claim 1, wherein the T1 is less than 1,000 μsec.

4. The method of claim 1, wherein the T1 is preferably 50 μsec.

5. The method of claim 1, wherein N is in a range of 2 and 4.

6. A method for monitoring a motor vehicle's electric power, which comprises the steps of:
  a) sampling a battery by enabling a power transistor to create a load for a period of time T1 and obtaining a sampled voltage value during the period of time T1, the sampling period is repeated N times, the period of time T1 being less than 1000 μsec, N being greater than 1;
  b) calculating an average voltage value of the N sampled voltage values;
  c) comparing the average voltage value with at least one voltage warning value;
  d) displaying a result of the calculation and providing a warning when the at least one voltage warning value is reached; and
  e) counting a predetermined period of time T2, wherein the counting step e) is started at an end of the preceding time period T1 and the counting step e) is ended by a starting of a subsequent time period T1.

7. The method for monitoring a motor vehicle's electric power according to claim 6, wherein the at least one voltage warning value includes a plurality of voltage warning values.

8. The method for monitoring a motor vehicle's electric power according to claim 6, wherein the sampling step (a) further comprises a step of connecting a resister serially with the power transistor.

9. A monitoring device for monitoring a motor vehicle's electric power, the electric power being provided by a battery and a power source connected in parallel, the monitoring device being connected in parallel to the electric power, the monitor device comprising:
  a) a stabilizing circuit;
  b) a CPU (central processing unit) connected to the stabilizing circuit;
  c) a voltage sampling circuit connected to the CPU;
  d) a current control circuit connected in parallel to the electric power and connected to the CPU; and
  e) a display circuit connected to the CPU,
  wherein the stabilizing unit provides a constant current to the monitoring device; the CPU controls the voltage sampling circuit, the current control circuit, and the display circuit; the current control circuit measures a current of the electric power in a range of about 1A to 300A for a period of time T1; and the CPU reads voltage and current values of the electric power through the voltage sampling circuit during one of a plurality of sampling periods, each sampling period lasting a period of time T1, and disables the sampling for a period of time T2 and displays a measured result through the display circuit.

10. The monitoring device of claim 9, wherein the current control circuit measures a current of the electric power between 1A and 300A.

11. The monitoring device of claim 9, wherein the monitoring device further comprises a battery polarity reverse protection circuit and an audio warning circuit connected to the CPU.

12. The monitoring device for monitoring a motor vehicle's electric power, the electric power being provided by a battery and a power source connected in parallel, the monitoring device being connected in parallel to the electric power according to claim 9, wherein the period of time T1 is less than 1000 μsec.

13. The monitoring device of claim 9, wherein the monitoring device further comprises a battery temperature sensor and a battery temperature detection circuit.

14. The monitoring device of claim 9, wherein the power source is an alternator or a charger.

15. The monitoring device of claim 14, wherein the monitoring device further comprises a power detection circuit the CPU, the power detection circuit collects current and voltage data from the electric power to send to the CPU for determining a status of the electric power, a digital display connected to the CPU, the digital display displays the measured result, and a digital signal interface converter connected to the CPU;
  such that when the alternator is operating or the electric power is charging, a voltage measured on a parallel side of the electric power will increase, thereby determining whether the alternator or the charger is operating correctly and the power detection circuit being capable of detecting an abnormal operation of the electric power, thereby enabling the CPU to issue a warning in form selected from the group consisting of a lamp, an audio, and a digital display.

* * * * *